(12) United States Patent
Beaury et al.

(10) Patent No.: US 9,869,547 B2
(45) Date of Patent: Jan. 16, 2018

(54) POSITION-MEASURING DEVICE AND METHOD FOR TESTING A CLOCK SIGNAL

(71) Applicant: Dr. Johannes Heidenhain GmbH, Traunreut (DE)

(72) Inventors: Bernhard Beaury, Uebersee (DE); Alexander Kobler, Burgkirchen (DE); Stephan Kreuzer, Surberg-Ettendorf (DE); Markus Mooshammer, Traunstein (DE); Peter Spindler, Palling (DE); Michael Walter, Polling (DE)

(73) Assignee: DR. JOHANNES HEIDENHAIN GMBH, Traunreut (DE)

( * ) Notice: Subject to any disclaimer, the term of this patent is extended or adjusted under 35 U.S.C. 154(b) by 568 days.

(21) Appl. No.: 14/492,115

(22) Filed: Sep. 22, 2014

(65) Prior Publication Data
US 2015/0088450 A1    Mar. 26, 2015

(30) Foreign Application Priority Data

Sep. 25, 2013 (DE) ........................ 10 2013 219 277

(51) Int. Cl.
 *G01R 31/00* (2006.01)
 *G01R 31/14* (2006.01)
 (Continued)

(52) U.S. Cl.
 CPC ............ *G01B 21/00* (2013.01); *G01D 5/244* (2013.01); *G01D 5/24457* (2013.01);
 (Continued)

(58) Field of Classification Search
 CPC .... G01B 21/00; G01D 5/244; G01D 5/24457; G01D 18/00; G01D 21/00; G01R 31/31727; G06F 13/4295
 (Continued)

(56) References Cited

U.S. PATENT DOCUMENTS 5,687,103 A    11/1997  Hagl et al.
6,233,534 B1 *  5/2001  Morozumi ............ G01D 9/005
                                              368/251
(Continued)

FOREIGN PATENT DOCUMENTS

EP    0660209 A1    6/1995
GB    2508788 A     6/2014
(Continued)

*Primary Examiner* — Michael Nghiem
(74) *Attorney, Agent, or Firm* — Leydig, Voit & Mayer, Ltd.

(57) ABSTRACT

A position-measuring device includes a position-sensing unit, a processing unit, an interface unit, a clock generator and a time measurement unit position-sensing unit configured to generate digital position values. The processing unit processes instructions from subsequent electronics. The interface unit communicates with the subsequent electronics, according to rules of an interface protocol, via at least one interface line that transmits interface signals having a temporal behavior that is determined by the interface protocol so as to transmit the instructions from the subsequent electronics to the processing unit. The clock generator generates a clock signal that serves as a time base for functions of the position-sensing unit and the processing unit. The time measurement unit uses the clock signal as a time base, receives at least one interface signal and measures a time interval between a start event and a stop event of the at least one interface signal.

13 Claims, 6 Drawing Sheets

(51) Int. Cl.

| | | |
|---|---|---|
| *G01C 17/00* | (2006.01) | |
| *G01B 21/00* | (2006.01) | |
| *G01D 18/00* | (2006.01) | |
| *G01R 31/317* | (2006.01) | |
| *G01D 5/244* | (2006.01) | |
| *G01D 21/00* | (2006.01) | |
| *G06F 13/42* | (2006.01) | |
| *G01D 3/08* | (2006.01) | |
| *H04L 7/04* | (2006.01) | |
| *H04L 7/00* | (2006.01) | |

(52) U.S. Cl.
CPC ............ *G01D 18/00* (2013.01); *G01D 21/00* (2013.01); *G01R 31/31727* (2013.01); *G06F 13/4295* (2013.01); *G01D 3/08* (2013.01); *H04L 7/0083* (2013.01); *H04L 7/04* (2013.01)

(58) Field of Classification Search
USPC ........................................ 702/122, 125, 150
See application file for complete search history.

(56) References Cited

U.S. PATENT DOCUMENTS

| | | | |
|---|---|---|---|
| 6,894,984 B2* | 5/2005 | Wastlhuber | G05B 19/042 |
| | | | 370/252 |
| 7,367,133 B2* | 5/2008 | Hagl | G01B 21/045 |
| | | | 33/503 |
| 8,520,705 B2 | 8/2013 | Beaury et al. | |
| 9,453,731 B2* | 9/2016 | Vos | G01C 17/34 |
| 2003/0135348 A1* | 7/2003 | Bratzdrum | G01S 5/0205 |
| | | | 702/176 |
| 2004/0006443 A1* | 1/2004 | Huber-Lenk | G01D 5/24476 |
| | | | 702/150 |
| 2011/0026572 A1 | 2/2011 | Kitahara | |
| 2011/0116501 A1 | 5/2011 | Beaury et al. | |
| 2011/0213586 A1* | 9/2011 | Kobler | G01D 5/244 |
| | | | 702/150 |
| 2012/0249028 A1* | 10/2012 | von Berg | G01D 5/24476 |
| | | | 318/400.05 |

FOREIGN PATENT DOCUMENTS

| | | |
|---|---|---|
| WO | WO 2009149966 A1 | 12/2009 |
| WO | WO 2011068080 A1 | 6/2011 |

* cited by examiner

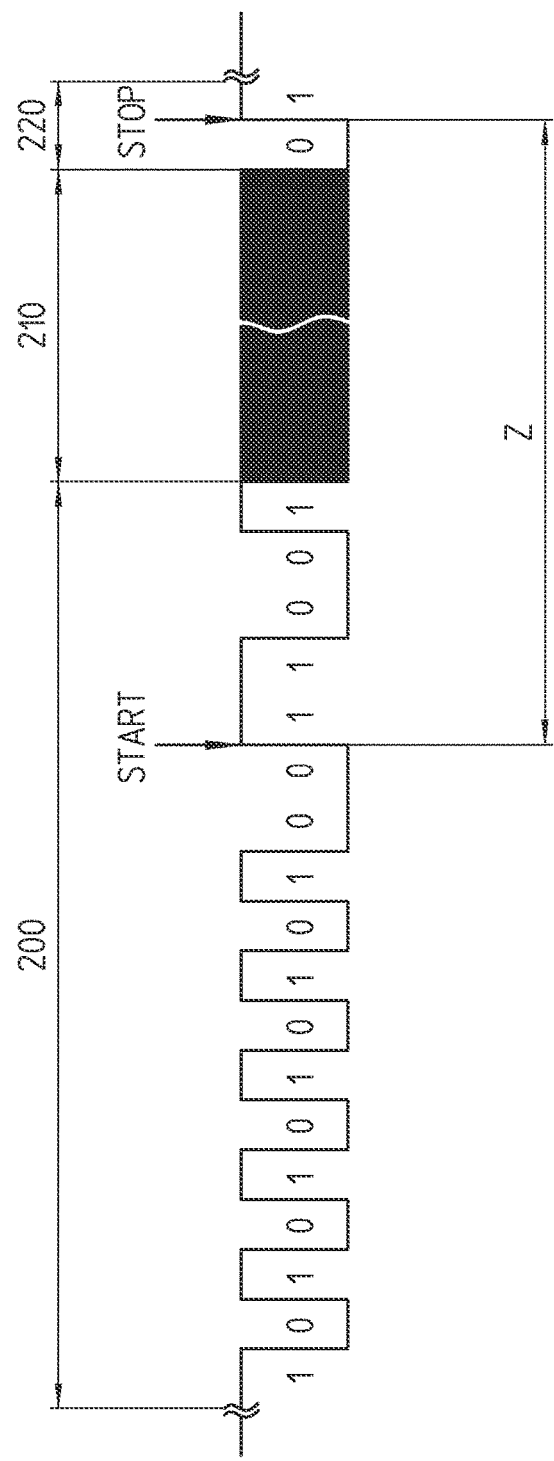

POSITION-MEASURING DEVICE AND METHOD FOR TESTING A CLOCK SIGNAL

CROSS-REFERENCE TO PRIOR APPLICATION

Priority is claimed to German Patent Application No. DE 10 2013 219 277.0, filed on Sep. 25, 2013, the entire disclosure of which is hereby incorporated by reference herein.

FIELD

The present invention relates to a position-measuring device with a position-sensing unit, a processing unit, an interface unit, and a clock generator, and to a method for testing a clock signal of such a position-measuring device.

BACKGROUND

A common and widespread application of position-measuring devices is in numerically controlled machine tools. In such machine tools, position-measuring devices are used to determine instantaneous position values which are needed by subsequent electronics, such as a numerical control system, to calculate setpoints for control circuits used to control the feed rate of a tool or workpiece. For this purpose, rotary encoders or angle-measuring devices are directly or indirectly coupled, for example, to the shaft of a motor, and length-measuring devices are coupled, for example, to a movable tool carriage.

Modern position-measuring devices generate digital absolute measurement values, which may be both position values and measurement values that are derived from the variation with time of position values, such as, for example, velocity or acceleration values. Also known are position-measuring devices which additionally acquire measurement values from sensors, such as temperature or vibration sensors, located inside or outside the position-measuring device. Transmission of the measurement values from the position-measuring device to the subsequent electronics is via digital data transmission interfaces. For an example of a position-measuring device of the above-mentioned type having a digital data transmission interface, reference is made here to EP 0 660 209 A1. Another digital data transmission interface for data transmission between a position-measuring device and subsequent electronics is disclosed in WO 2009/149966 A1. In order to provide the necessary functions (acquiring position signals, processing the position signals into digital position values or measurement values derived therefrom, communicating with the subsequent electronics), complex analog and digital circuit blocks are needed.

SUMMARY

In an embodiment, the present invention provides a position-measuring device including a position-sensing unit, a processing unit, an interface unit, a clock generator and a time measurement unit position-sensing unit configured to generate digital position values. The processing unit processes instructions from subsequent electronics. The interface unit communicates with the subsequent electronics, according to rules of an interface protocol, via at least one interface line that transmits interface signals having a temporal behavior that is determined by the interface protocol so as to transmit the instructions from the subsequent electronics to the processing unit. The clock generator generates a clock signal that serves as a time base for functions of the position-sensing unit and the processing unit. The time measurement unit uses the clock signal as a time base, receives at least one of the interface signals and measures a time interval between a start event and a stop event of the at least one of the interface signals.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following:

FIG. 2*b* shows a second example of a time interval to be measured, illustrated by a signal diagram of an instruction cycle;

DETAILED DESCRIPTION

Figure 1A:
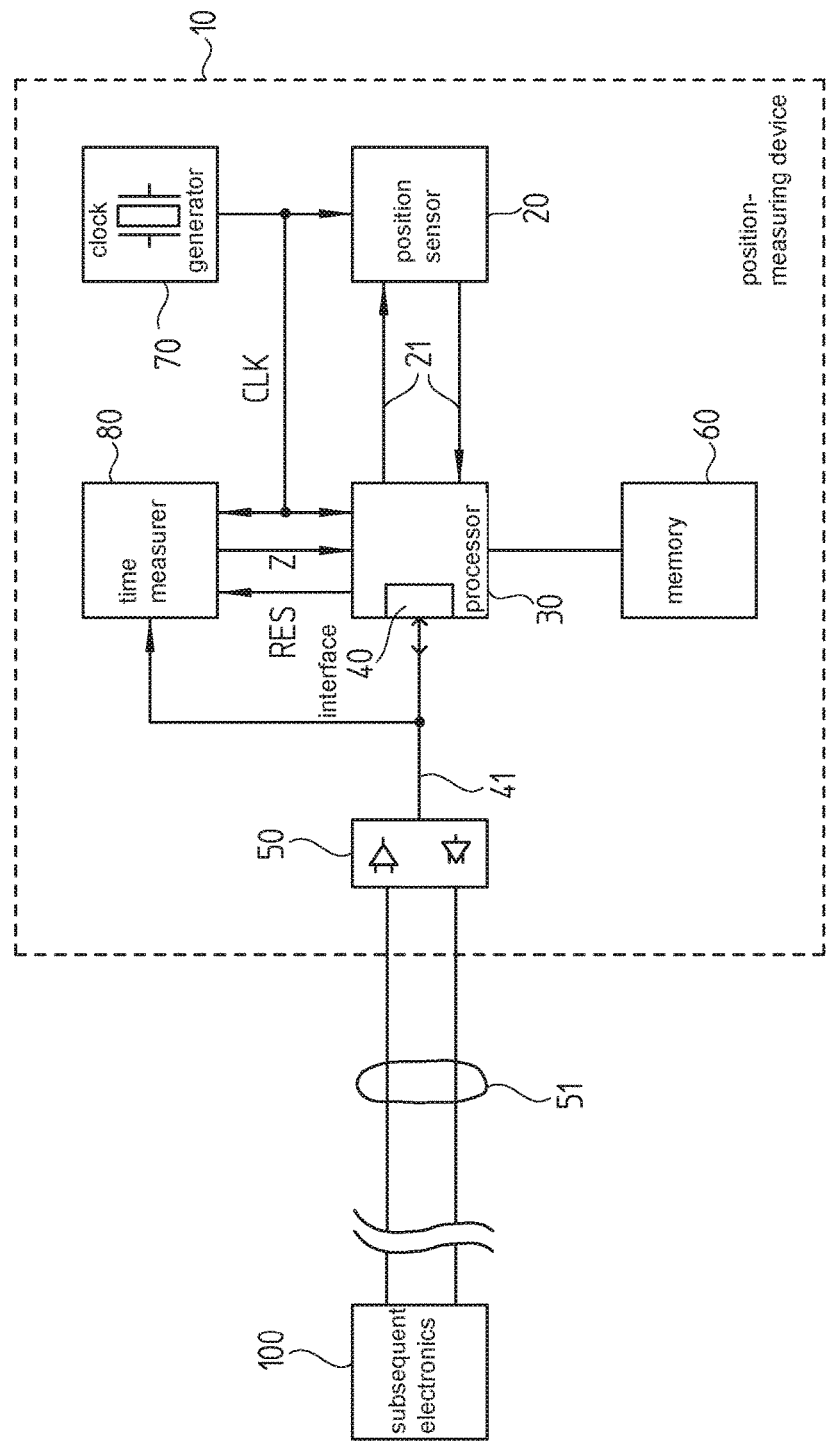
FIG. 1*a* is a block diagram of a first embodiment of a position-measuring device according to the present invention.

A central unit in position-measuring devices is a clock generator that generates a clock signal which serves as a time base for many functional blocks of the position-measuring device including, for example, A/D converters, finite-state automatons, the digital data transmission interface or, in some cases, a microprocessor or microcontroller as part of a central processing unit. If the frequency of the clock signal changes because of a malfunction, it may happen that functional blocks operate out of specifications, which in turn may result in measurement errors, sporadic failures, etc.

Some of the errors so caused may not be detected in the subsequent electronics, especially if they result in erroneous measurement values. In bad cases, in a machine tool, for example, the workpiece being processed may thereby be rendered useless, or even the machine tool may become damaged. Even worse than the material damage that may occur is the risk of injury to operating personnel. Hence, it is important to ensure proper functioning of the clock generator.

In an embodiment, the present invention provides a position-measuring device in which the frequency of the clock signal is monitored.

In an embodiment, the position-measuring device includes a position-sensing unit, a processing unit, an interface unit, and a clock generator, where:

the position-sensing unit is capable of generating digital position values, the processing unit is suitably adapted to process instructions which are transmittable thereto from subsequent electronics via the interface unit, the interface unit is suitably adapted to communicate with the subsequent electronics according to the rules of an interface protocol via at least one interface line capable of transmitting interface signals whose temporal behavior is determined by the interface protocol, and the clock generator generates a clock signal which serves as a time base for the functions of the position-sensing unit and the processing unit.

Also provided in an embodiment of the position-measuring device is a time measurement unit, which also uses the clock signal as a time base and receives at least one interface signal, and which is capable of measuring a time interval between a start event and a stop event of the at least one interface signal.

A further embodiment of the present invention provides a method for monitoring the clock signal of a position-measuring device.

In an embodiment, the method for testing a clock signal of a position-measuring device which includes a position-sensing unit, a processing unit, an interface unit, and a clock generator, includes the following features:

the position-sensing unit is capable of generating digital position values, the processing unit is suitably adapted to process instructions which are transmittable thereto from subsequent electronics via the interface unit, the interface unit is suitably adapted to communicate with the subsequent electronics according to the rules of an interface protocol via at least one interface line capable of transmitting interface signals whose temporal behavior is determined by the interface protocol, and the clock generator generates the clock signal that serves as a time base for the functions of the position-sensing unit and the processing unit.

Also provided in n embodiment of the position-measuring device is a time measurement unit, which also uses the clock signal as a time base and receives at least one interface signal. In order to test the clock signal, the time measurement unit measures a time interval between a start event and a stop event of the at least one interface signal.

FIG. 1a shows a block diagram of a position-measuring device 10 according to the present invention. Central functional units of position-measuring device 10 are a position-sensing unit 20 and a processing unit 30. Position-sensing unit 20 is suitably adapted to generate digital position values. For this purpose, it may, for example, include a measuring standard having a measuring graduation, a scanning unit for scanning the measuring graduation, as well as signal-processing electronics for generating the digital position value from the scanning signals of the scanning unit. The measuring standard and the scanning unit are arranged to be movable relative to each other, and are mechanically connected to machine parts whose relative position is to be measured. If position-measuring device 10 is a rotary encoder to measure the angular position of the shaft of an electric motor, then the scanning unit (or the housing of the rotary encoder) may be attached, for example, to a motor housing, and a shaft of the rotary encoder, which is non-rotatably connected with the measuring standard, is connected to the motor shaft to be measured via a shaft coupling.

In an embodiment, the physical scanning principle underlying the position-sensing unit 20 is irrelevant. It may, for example, be an optical, magnetic, capacitive or inductive scanning principle. Depending on the processing steps required to process the scanning signals of the scanning unit into position values, the signal-processing electronics includes functional units performing processing steps such as amplification, signal correction (offset correction, amplitude correction, phase correction), interpolation, counting grating periods, A/D conversion, etc.

The generation of position values in position-sensing unit 20 may be performed continuously (cyclically) or only upon request from processing unit 30. Signals lines 21 are provided for transmission of corresponding control signals to position-sensing unit 20 and position values to processing unit 30.

In processing unit 30, the position values may be processed further, if necessary, to obtain output data. For this purpose, processing steps such as scaling, changing the data format, error correction, etc. may be required, which are performed purely digitally in processing unit 30. However, output data may not only be position values, but also velocity or acceleration values that are calculated in processing unit 30 from a plurality of successively generated position values.

In order for the processes in position-sensing unit 20 and processing unit 30 to be synchronized and performed in a precise time pattern, a clock generator 70 is provided in position-measuring device 10 to generate a clock signal serving as a time base. The clock signal is fed to position-sensing unit 20 and processing unit 30.

An interface unit 40 is provided in processing unit 30 to enable communication with subsequent electronics 100.

In particular, the output data is transmitted to subsequent electronics 100 via interface unit 40. The physical connection between interface unit 40 and subsequent electronics 100 is provided by at least one interface line 41 in position-measuring device 10 and an interface cable 51, between which a transmitter/receiver unit 50 is often provided, which converts signals to be transmitted, which are mostly present in the form of single-ended signals in position-measuring device 10, into differential signals according, for example, to the commonly used RS-485 standard, and generates single-ended signals from the differential signals received by position-measuring device 10 from subsequent electronics 100.

Alternatively, the data may also be transmitted optically between interface unit 40 and subsequent electronics 100. In such a variant, transmitter/receiver unit 50 would be implemented, for example, as a converter unit for converting electrical signals into optical signals (and vice versa), and interface cable 51 would be an optical waveguide.

For the sake of completeness, it should be noted that power and voltage supply to position-measuring device 10 may also be accomplished via interface cable 51, and that position-measuring device 10 may be provided with a connector or connecting terminals for the connection of interface cable 51.

The manner in which communication is performed between subsequent electronics 100 and position-measuring device 10 is defined in an interface protocol. Often, a so-called request/response scheme is employed; i.e., subsequent electronics 100 (master) sends an instruction, possibly followed by data, to position-measuring device 10 (slave), which processes the instruction and may transmit requested data to subsequent electronics 100. Instructions may generally be write and/or read commands, for example, to write to or read from memory cells in processing unit 30 or in a memory unit 60 associated with processing unit 30. A special position request command may be provided for initiating a position measurement and transmitting a position value as an output datum to subsequent electronics 100.

Instructions and data are transmitted in the form of data frames structured according to the definitions of the data transmission protocol. The following is a list of several typical components of data frames:

Start Sequence (Preamble)

The start sequence initiates the transmission of a data frame and serves to tell the slave (position-measuring device 10) to expect instructions/data. The simplest form of a start sequence is a single bit (start bit). More complex start sequences may include, for example, alternating sequences of logic high and low levels, from which the data transfer rate can be derived.

Instruction

Instructions inform the slave (position-measuring device 10) of the type of access (e.g., read or write access). Instructions can have a defined length, such as 8 bits.

Receive Data

Receive data is data that is transmitted from the master (subsequent electronics 100) to the slave (position-measuring device 10). Receive data may include addresses which, in the case of a read command, indicate the memory address from which to read data, and in the case of a write command, indicate the memory address to which to write data.

Transmit Data

Transmit data is data that is requested by the master (subsequent electronics 100) by a command and which is transmitted from the slave (position-measuring device 10) to the master (subsequent electronics 100). Transmit data includes, in particular, the measurement values (e.g., position values) acquired in the position-measuring device.

End Sequence (Postamble)

The end sequence terminates the transmission of the data frame. The end sequence may be a single bit (stop bit), but may also contain additional data, such as, for example, a checksum (CRC) which is calculated from the contents of the data frame and enables the master (subsequent electronics 100) to detect bit errors in the data transmission.

In additional or as an alternative to the checksum in the end sequence, receive and/or transmit data may also contain checksums.

The transmission of data frames occurs in a time pattern which is determined by an interface clock signal. The interface clock signal may be transmitted as a separate interface signal in parallel with the data frames, as described in the above-mentioned EP 0 660 209 A1, or as part of the data stream that transmits the data frames, such as is disclosed in WO 2009/149966 A1. In the latter case, the interface clock signal is separated from the received data stream in the respective receiving unit (clock recovery) and is then used for the reading and possibly also for the transmission of data. Alternatively, an interface clock signal may also be generated in both the transmitting unit and the receiving unit. In this case, at the beginning of the data transmission, the arriving data stream is synchronized in the receiving unit with the interface clock signal of the receiving unit.

As will be illustrated hereinbelow, the time pattern of the data transmission, which is determined by the interface clock signal, can be used in conjunction with the interface protocol to generate a parameter that is a measure of the stability of the clock signal of position-measuring device 10.

As described above, a change in the frequency of the clock signal may impair the functioning of position-measuring device 10. While a total failure of the clock signal, for example, in the event of a defective clock generator 70, causes an obvious, and therefore easily recognizable, malfunction of position-measuring device 10, permanent, sporadic or dynamic changes in the frequency of the clock signal can result in inconsistent fault symptoms, which are difficult to identify, but negatively affect the overall operation of a machine in which position-measuring device 10 is used. For example, measurement values, in particular position values, of position-measuring device 10 can be corrupted, which may deteriorate the performance of a drive control. For example, if position-measuring device 10 is employed in a machine tool, the surface finish of a workpiece machined in the machine tool may deteriorate without any obvious reasons.

In extreme cases, corrupted measurement values may affect positioning operations to the extent that damage may occur to the machine or even that operating personnel may be exposed to a hazard.

In accordance with an embodiment of the present invention, position-measuring device 10 is provided with a time measurement unit 80, which receives clock signal CLK on the one hand, and at least one interface signal of an interface line 41 on the other hand. Time measurement unit 80 is capable of measuring time intervals which are determined by events, in particular a start event and a stop event, in the at least one interface signal. Typical start and stop events include, for example, defined signal edges or unique bit sequences, or a combination of both, for example, a unique bit sequence followed by a signal edge.

Time measurement unit 80 may measure time intervals absolutely or relatively. In the case of absolute measurement, time measurement unit 80 is reset upon completion of the measurement, either automatically or by a reset signal RES from processing unit 30. In the case of relative measurement, the measurement value of the preceding measurement is in each case retained, and each time a new measurement is made, the new time interval is added. In relative measurements, it is thereby ensured that the new measurement value differs from the preceding one, and therefore this variant is particularly suited for safety-critical applications.

The time interval Z measured in time measurement unit 80 is fed to processing unit 30, which passes it on to interface unit 40, possibly after processing it (scaling, adapting the data format, etc.). Time interval Z may then be transmitted from interface unit 40 to subsequent electronics 100 in accordance with the interface protocol.

Figure 1B:
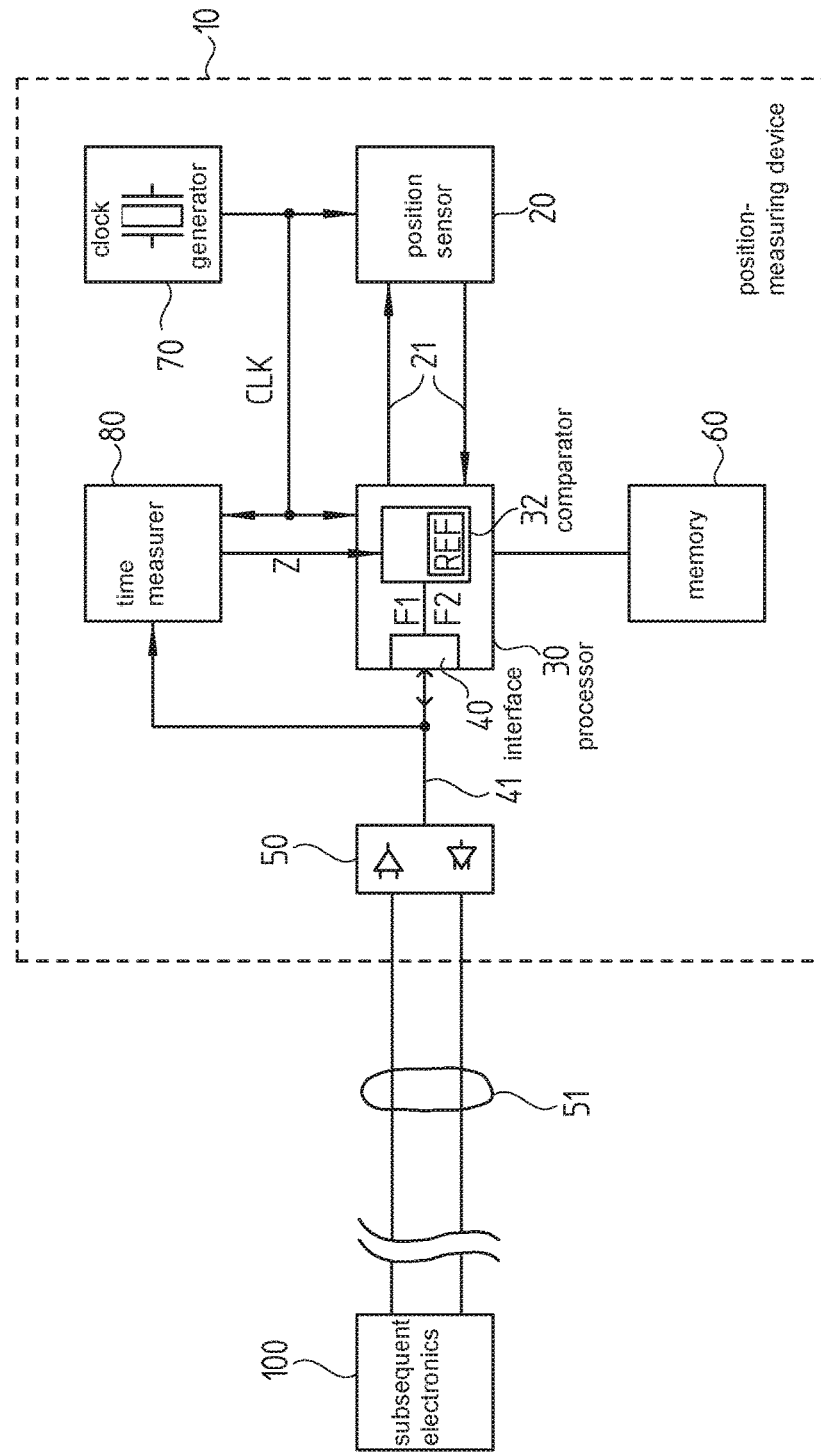
FIG. 1*b* is a block diagram of a further embodiment of a position-measuring device according to the present invention.

FIG. 1b shows a block diagram of an alternative embodiment of a position-measuring device 10. Functional blocks corresponding to those already described in connection with FIG. 1a have been given the same reference numerals. In this exemplary embodiment, processing unit 30 further includes a comparator unit 32, which receives the measured time interval Z. By comparison with a reference value REF, comparator unit 32 generates at least one status bit indicating the level of match of the measured time interval Z with reference value REF. The at least one status bit may include an error bit F1 indicating that the measured time interval Z deviates unacceptably from reference value REF, as well as a warning bit F2 indicating a still tolerable deviation of the time interval from reference value REF. The at least one status bit F1, F2 is in turn fed to interface unit 40 for transmission to subsequent electronics 100.

Reference value REF may be stored in comparator unit 32 either permanently or alterably. Accordingly, either a permanently programmed memory (ROM, OTP) or an alterable memory (EEPROM, RAM) is provided for this purpose. The latter may be programmed, for example, by subsequent electronics 100 via the interface connection.

Figure 2A:
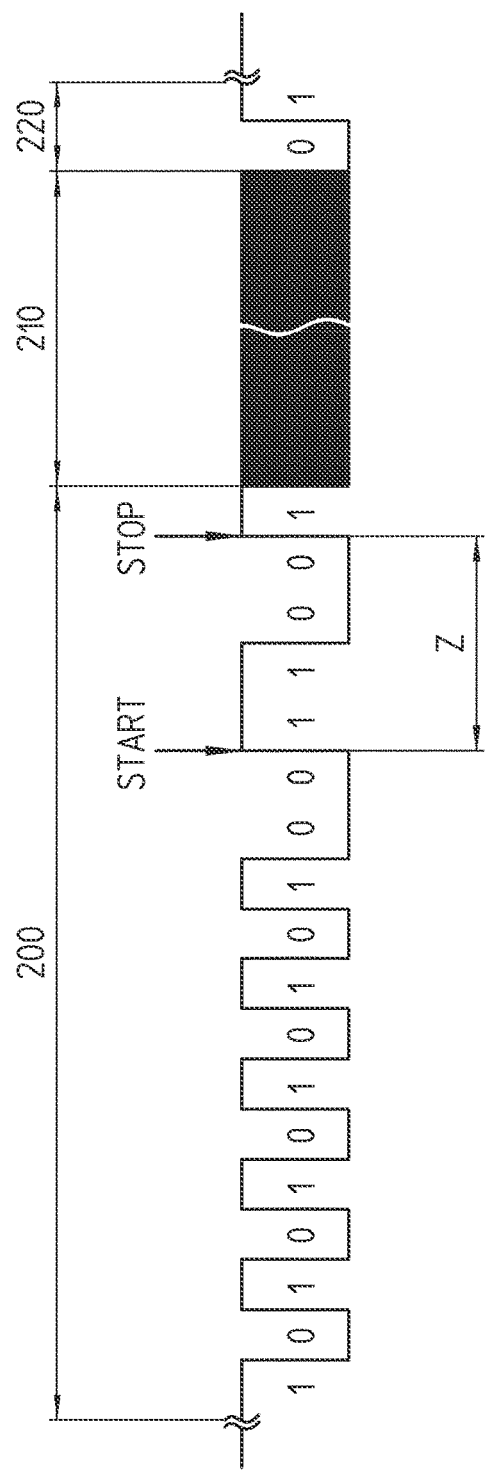
FIG. 2*a* shows a first example of a time interval to be measured, illustrated by a signal diagram of an instruction cycle.

FIGS. 2a and 2b each show a signal diagram of an instruction cycle to illustrate examples of start and stop events that define time intervals Z which can be measured by time measurement unit 80.

In accordance with the rules of the interface protocol underlying the communication of position-measuring device 10; i.e., its interface unit 40, with subsequent electronics 100, the instruction cycle is initiated by a start sequence (preamble) 200, followed by a command/data block 210 which may contain a command and, possibly, receive data from subsequent electronics 100 to position-measuring device 10, as well as transmit data, which is transmitted from position-measuring device 10 to subsequent electronics 100. The instruction cycle is terminated by an end sequence (postamble) 220 signaling the end of the cycle.

Start sequence 200 begins with a regular sequence of logic high and low levels of equal duration. The alternating high and low bits are followed by two each bits of logic low, logic high, and logic low. Start sequence 200 is terminated by a logic high bit, which represents the transition to command/data block 210.

End sequence 220 is composed of a logic low bit, followed by a logic high bit.

Before and after the instruction cycle, the interface signal has a permanent logic high level.

FIG. 2a shows a first example of a time interval Z which can be measured by time measurement unit 80 within the instruction cycle shown. The start event START, which marks the beginning of the measurement of time interval Z, is the first rising signal edge of the interface signal after the first occurrence of two successive logic low bits. The stop event STOP, which terminates the time measurement, is the first rising signal edge after the second occurrence of two successive logic low bits.

FIG. 2b shows a second example of a time interval Z that can be measured by time measurement unit 80 within an instruction cycle. The start event START, which marks the beginning of the measurement of time interval Z, is identical to the start event of FIG. 2a, and thus is defined by the first rising signal edge of the interface signal after the first occurrence of two successive logic low bits. The stop event STOP, which terminates the time measurement, is the rising signal edge that occurs between the logic low bit and the logic high bit in the end sequence 220 of the instruction cycle.

Figure 3A:
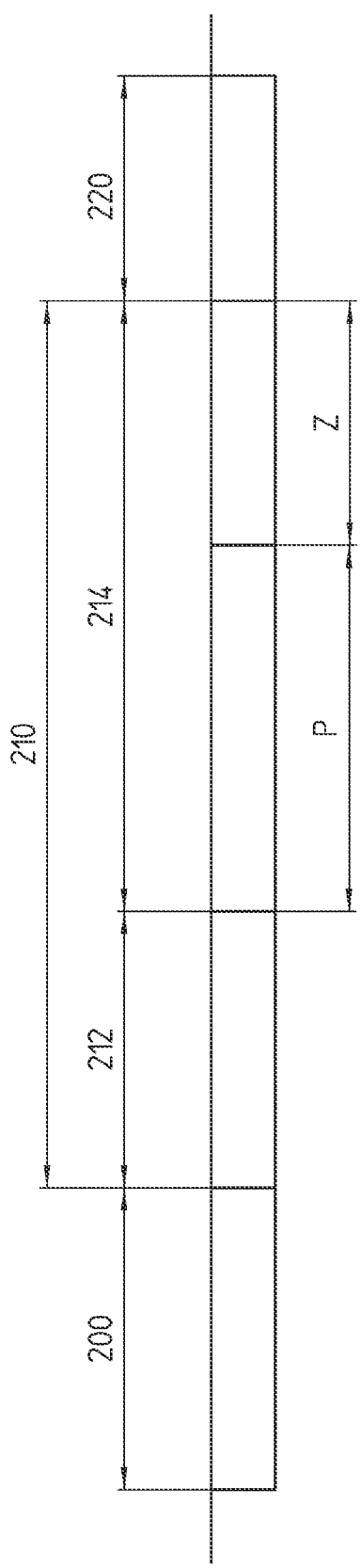
FIG. 3*a* shows a first signal diagram illustrating the transmission of the measurement result to subsequent electronics.
Figure 3B:
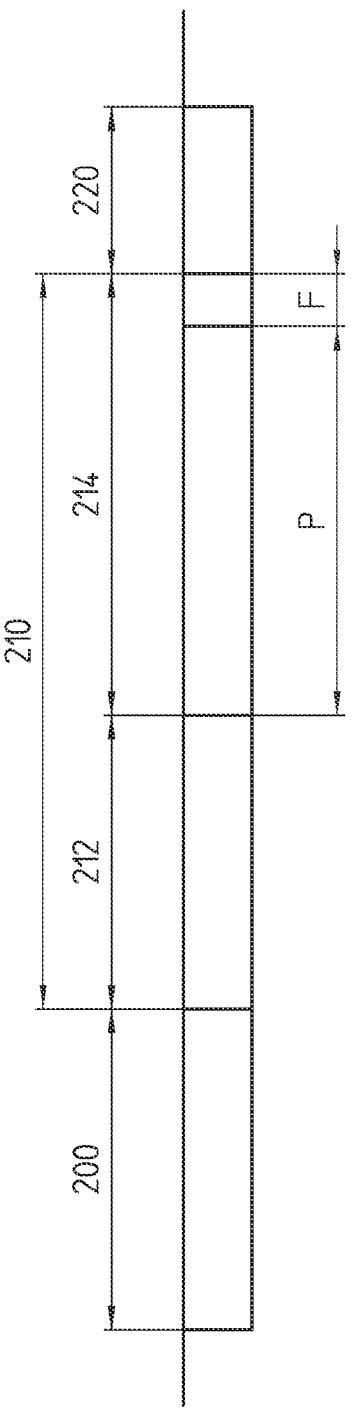
FIG. 3*b* shows a second signal diagram illustrating the transmission of the measurement result to subsequent electronics.

FIGS. 3a and 3b show simplified signal diagrams of an instruction cycle to illustrate options for transmitting the result of the time measurement. The instruction cycles each include a start sequence 200, a command/data block 210 and an end sequence 220. Command/data block 210 is made up of a command 212 and transmit data 214 which is transmitted from position-measuring device 10 to subsequent electronics 100 in accordance with command 212. For example, if command 212 is a position request command, then transmit data 214 contains a position value P. Transmit data 214 further includes the result of the time measurement or the clock monitoring result, namely, in case of FIG. 3a, the value of the measured time interval Z, and in the case of FIG. 3b, at least one status bit F generated in processing unit 30 through comparison of the measured time interval Z with a setpoint. As already mentioned in the description of FIG. 1b, the at least one status bit F may be, for example, an error bit F1 or a warning bit F2. Thus, the signal diagram shown in FIG. 3a corresponds to the embodiment described with reference to FIG. 1a, and the signal diagram shown in FIG. 3b corresponds to the embodiment described with reference to FIG. 1b.

It should be explicitly noted that time interval Z and the at least one status bit F may also be values which were measured/determined in a preceding instruction cycle. This applies especially when choosing a stop event STOP that occurs at a late point in the instruction cycle, because then there may not yet be a current measurement result available. In the example of FIG. 2b, stop event STOP occurs even after the transmission of the transmit data and, obviously therefore, no current measurement result can be available yet.

Figure 4A:
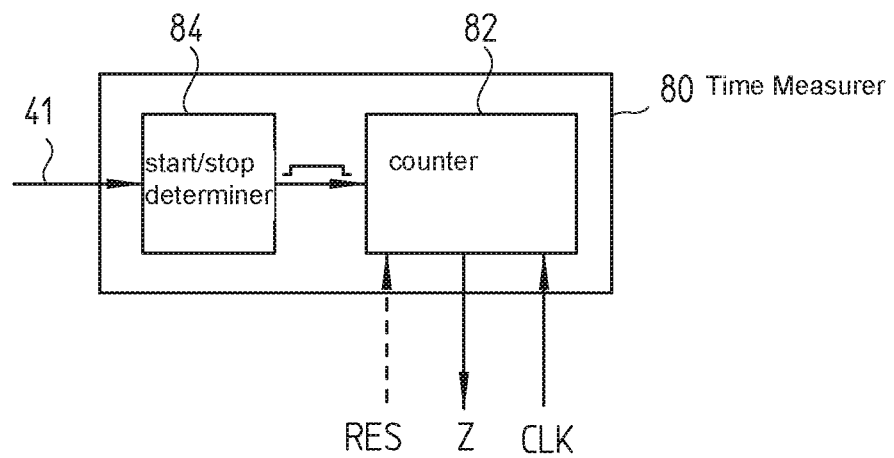
FIG. 4*a* is a block diagram of a first embodiment of a time measurement unit.

FIG. 4a shows a block diagram of a possible configuration of a time measurement unit 80 according to the exemplary embodiment described with reference to FIG. 1a. It includes a counter 82 and a start/stop unit 84. Counter 82 receives clock signal CLK as the signal to be counted. Thus, clock signal CLK serves as a time base for counter 82 and determines the resolution of the measured time intervals Z. Usually, such a counter 82 is adapted to count state changes of the clock signal; i.e., it may count one step in response to, for example, each rising edge, each falling edge, or both each rising and falling edge. The input to start/stop unit 84 is the interface signal on the at least one interface line 41, which is monitored by the start/stop unit for the occurrence of a start or stop event. By suitable control signals, start/stop unit 84 triggers counter 82 to start counting in response to the occurrence of a start event, and stops it in response to the occurrence of a stop event. The output of counter 82 is fed to processing unit 30. Counter 82 may be reset by processing unit 30 by means of an optional reset signal RES, for example, for an absolute time measurement.

Figure 4B:
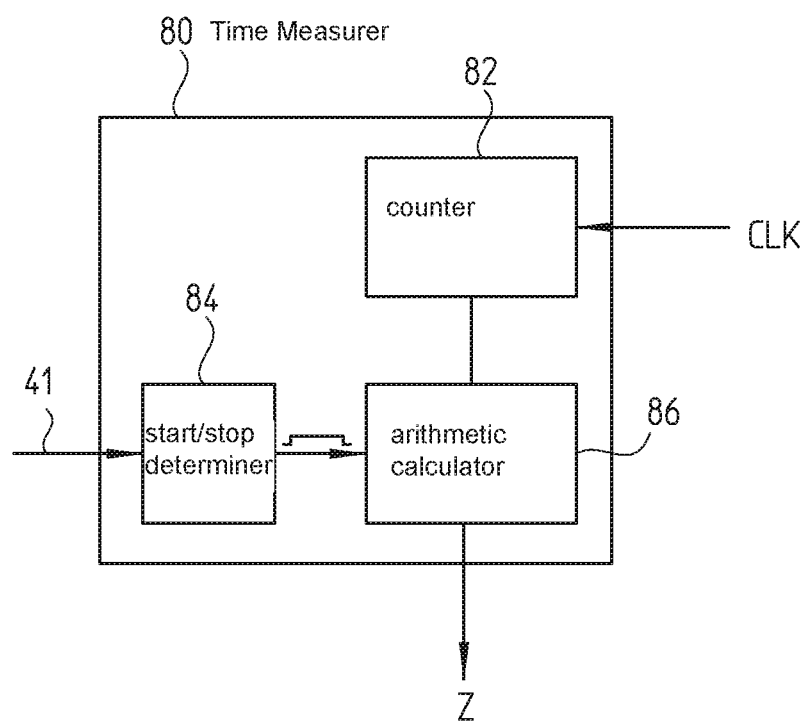
FIG. 4*b* is a block diagram of a second embodiment of a time measurement unit.

FIG. 4b shows a block diagram of a possible configuration of a time measurement unit 80 according to the exemplary embodiment described with reference to FIG. 1b. Here, counter 82 is operated as what is known as a free-running counter. This means that counter 82 counts continuously at the rate of clock signal CLK. To determine the count difference between the start event and the stop event, which corresponds to the time interval Z to be measured, the output of counter 82 is fed to an arithmetic unit 86 which, in response to both the occurrence of the start event and the occurrence of the stop event, takes the current counter value and calculates the count difference, and thus, the sought result time interval therefrom. The occurrence of the start event and occurrence of the stop event are signaled to arithmetic unit 86 by start/stop unit 84. Relative time measurement can also be accomplished in this embodiment by adding the measured time interval Z to the preceding measurement result in arithmetic unit 86.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A position-measuring device for measuring a position of an object, comprising:
   a position sensor configured to generate digital position values;
   a processor configured to process instructions from subsequent electronics;
   an interface configured to communicate with the subsequent electronics, according to rules of an interface protocol, via at least one interface line configured to transmit interface signals having a temporal behavior determined by the interface protocol so as to transmit the instructions from the subsequent electronics to the processor;
   a clock generator configured to generate a clock signal that serves as a time base for functions of the position sensor and the processor; and
   a time measurer configured to use the clock signal as a time base, to receive at least one of the interface signals and to measure a time interval between a start event and a stop event of the at least one of the interface signals,
   wherein the processor is configured to receive the measured time interval and transmit the measured time interval, via the interface, to the subsequent electronics for further processing.

2. The position-measuring device as recited in claim 1, wherein the time measurer includes a counter configured to receive the clock signal as a signal to be counted.

3. The position-measuring device as recited in claim 2, wherein the time measurer includes a start/stop determiner configured to determine the start event and the stop event from the at least one of the interface signals.

4. The position-measuring device as recited in claim 2, wherein the counter is configured to measure the time interval by counting during a time period between the start event and the stop event.

5. The position-measuring device as recited in claim 2, wherein the counter is resettable by the processor by a reset signal.

6. The position-measuring device as recited in claim 2, wherein the counter is a continuously running counter, and wherein the time measurer includes an arithmetic calculator configured to calculate the time interval from a first counter value at the occurrence of the start event and a second counter value at the occurrence of the stop event.

7. A method for testing a clock signal of a position-measuring device for measuring a position of an object, wherein said position-measuring device includes a position sensor, a processor, an interface, a clock generator and a time measurer, the method comprising:

generating, by the position sensor, digital position values;
receiving, at the processor via the interface, instructions from subsequent electronics, the interface communicating with the subsequent electronics according to rules of an interface protocol via at least one interface line transmitting interface signals having a temporal behavior determined by the interface protocol;
processing, by the processor, the instructions;
generating, by the clock generator, a clock signal that serves as a time base for functions of the position sensor and the processor;
receiving, by the time measurer, at least one of the interface signals;
measuring, by the time measurer, a time interval between a start event and a stop event of the at least one of the interface signals, the time measurer using the clock signal as a time base; and
feeding the measured time interval to the processor and transmitting the measured time interval, via the interface, to the subsequent electronics for further processing.

8. The method as recited in claim 7, wherein the start event and the stop event are determined from the at least one of the interface signals by a start/stop determiner of the time measurer.

9. The method as recited in claim 8, wherein a counter of the time measurer which receives the clock signal as a signal to be counted measures the time interval by counting during a time period between the start event and the stop event.

10. The method as recited in claim 9, further comprising resetting, by the processor, the counter by a reset signal.

11. The method as recited in claim 7, wherein the time measurer includes a counter which is a continuously running counter, and wherein the time measurer includes an arithmetic calculator which calculates the time interval from a first counter value at the occurrence of the start event and a second counter value at the occurrence of the stop event.

12. A position-measuring device for measuring a position of an object, comprising:
   a position sensor configured to generate digital position values;
   a processor configured to process instructions from subsequent electronics;
   an interface configured to communicate with the subsequent electronics, according to rules of an interface protocol, via at least one interface line configured to transmit interface signals having a temporal behavior determined by the interface protocol so as to transmit the instructions from the subsequent electronics to the processor;
   a clock generator configured to generate a clock signal that serves as a time base for functions of the position sensor and the processor; and
   a time measurer configured to use the clock signal as a time base, to receive at least one of the interface signals and to measure a time interval between a start event and a stop event of the at least one of the interface signals,
   wherein the processor is configured to receive the measured time interval and to generate, in a comparator of the processor, at least one status bit by a comparison of the measured time interval with a reference value, the interface being configured to transmit the at least one status bit to the subsequent electronics.

13. A method for testing a clock signal of a position-measuring device for measuring a position of an object, wherein said position-measuring device includes a position sensor, a processor, an interface, a clock generator and a time measurer, the method comprising:

generating, by the position sensor, digital position values;

receiving, at the processor via the interface, instructions from subsequent electronics, the interface communicating with the subsequent electronics according to rules of an interface protocol via at least one interface line transmitting interface signals having a temporal behavior determined by the interface protocol;

processing, by the processor, the instructions;

generating, by the clock generator, a clock signal that serves as a time base for functions of the position sensor and the processor;

receiving, by the time measurer, at least one of the interface signals;

measuring, by the time measurer, a time interval between a start event and a stop event of the at least one of the interface signals, the time measurer using the clock signal as a time base; and feeding the measured time interval to the processor, generating, in a comparator of the processor, at least one status bit by a comparison of the time interval with a reference value, and transmitting the at least one status bit, via the interface, to the subsequent electronics.

\* \* \* \* \*